United States Patent [19]

Chang

[11] Patent Number: 5,763,309
[45] Date of Patent: Jun. 9, 1998

[54] SELF-ALIGNED ISOLATION AND PLANARIZATION PROCESS FOR MEMORY ARRAY

[75] Inventor: Yun Chang, Hsinchu, Taiwan

[73] Assignee: Macronix International Co., Ltd., Hsinchu, Taiwan

[21] Appl. No.: 668,942

[22] Filed: Jun. 24, 1996

[51] Int. Cl.$^6$ .................................................. H01L 21/336
[52] U.S. Cl. ........................ 438/262; 436/257; 436/296; 436/297; 436/425
[58] Field of Search .................... 438/257, 262, 438/263, 296, 297, 359, 425

[56] References Cited

U.S. PATENT DOCUMENTS

| | | |
|---|---|---|
| 4,139,442 | 2/1979 | Bondur et al. . |
| 4,597,060 | 6/1986 | Mitchell et al. . |
| 4,892,840 | 1/1990 | Esquivel et al. . |
| 5,045,489 | 9/1991 | Gill et al. . |
| 5,173,436 | 12/1992 | Gill et al. ............................ 438/262 |
| 5,397,725 | 3/1995 | Wolstenholme et al. . |
| 5,506,160 | 4/1996 | Chang ................................... 438/262 |
| 5,526,307 | 6/1996 | Yiu et al. . |

OTHER PUBLICATIONS

Aritome, et al., "A 0.67μm$^2$ Self-Aligned Shallow Trench Isolation Cell(SA-STI Cell) For 3V-only 256Mbit NAND EEPROMs," IEDM, pp. 61-64, (1994).

Kato, et al., "A 0.4μm$^2$ Self-Aligned Contactless Memory Cell Technology Suitable for 256-Mbit Flash Memories," IEDM, pp. 921-923, (1994).

*Primary Examiner*—Trung Dang
*Attorney, Agent, or Firm*—Wilson Sonsini Goodrich & Rosati

[57] ABSTRACT

A self-aligned planarization and isolation technique achieves smaller dimension memory cells using self-aligned isolation trenches. The process involves defining the lines of buried diffusion and first layer of polysilicon using a single mask. A protective oxide is formed between the polysilicon lines. Then a second mask is used with non-critical alignment to select polysilicon lines to define self-aligned etch regions. The trenches are made using a high selectivity etching recipe which etches through polysilicon and the silicon substrate in the selected lines faster than the protective oxide. Thus, a single mask defines the diffusion regions, the first layer of polysilicon, and the isolation trenches. The mask used for selecting polysilicon lines for definition of isolation structures does not need to be critically aligned, removing the alignment tolerance for formation of the isolation structures out of the layout of the array.

32 Claims, 6 Drawing Sheets

SELF-ALIGNED ISOLATION AND PLANARIZATION PROCESS FOR MEMORY ARRAY

BACKGROUND OF THE INVENTION

Field of the Invention

The present invention relates to the manufacture of high density integrated circuit memory arrays; and more particularly to the formation of isolation structures within such memory arrays. The invention is particularly suited to non-volatile memory, such as read-only memory, EPROM, EEPROM, and flash memory.

Description of Related Art

In the manufacture of high density memory, array density is largely determined largely by the memory cell layout, and by the scalability of that layout with shrinking critical dimensions. As the critical dimensions shrink below the half micron area, scalabililty of the layout becomes limited by the resolution of the manufacturing process, and by the alignment tolerances which can be achieved with the masks used in the design. The alignment of masks is limited by the mechanical techniques used to place the mask over a wafer in process, and by the techniques used to consistently print patterns on masks in alignment from mask to mask. To control alignment tolerances in a chip design, it is desirable to use fewer alignment critical masks, because the alignment tolerances accumulate to cause misalignment errors in the layout of the array. Thus, so-called "self-aligned" processing steps have been developed.

Many high density memory designs require isolation structures between columns of cells in the array. Traditionally, these isolation structures have been formed using a thermal field oxide process, such as well-known LOCOS. The traditional approach has involved a mask step to identify the isolation areas, followed by the process of growing a thick field oxide in these areas. After establishment of the isolation structures, masking steps to form the memory cells are carried out. Therefore, the alignment tolerances involved in the formation of the isolation structures, and the alignment tolerances involved in the layout of the memory cells in the array combine to cause misalignment which can have substantial impacts on performance, particularly with arrays using very small critical dimensions.

One prior art approach is described in Kim, K. S., et al., IEDM 94 pp. 921-923. In this reference, the isolation structures are formed which are self-aligned with the floating gate structures in a non-volatile memory. This prior art process involves patterning floating gate polysilicon into a plurality of columns. This polysilicon is topped with an oxide layer, and then covered by a thick silicon nitride layer, and anisotropically etched back. This leaves thick silicon nitride side walls on the columns of floating gate polysilicon. This structure is then exposed to a thermal oxidation process causing development of field oxide in the regions between the floating gate polysilicon columns, and spaced away from the floating gates by the silicon nitride spacers, which inhibit oxide growth. The spacers are then removed and the source and drain implants are carried out using the floating gate polysilicon for self-alignment. Thus, the source and drain diffusion regions are self-aligned between the floating gate polysilicon and the field oxide regions. A planarization process is executed, followed by formation of the balance of the array.

This prior art process achieves self-aligned isolation for the memory array. However, it suffers several disadvantages.

In particular, the presence of silicon nitride over the floating gate, particularly in the region of the tunnel oxide between the floating gate and substrate, during the high temperature thermal oxidation process causes stresses on the structure due to the different coefficients of thermal expansion of silicon nitride and silicon dioxide. Stresses degrade device reliability. In addition, the high temperature process used to grow the isolation oxide, exposes the interface between the tunnel oxide and the polysilicon to high temperature, causing an increase in grain growth at that interface, and degrading device performance.

Furthermore, the traditional field oxide approach to forming isolation structures results in an uneven surface topology. Thus, additional planarization steps are required to be utilized after layout of the memory array, and before depositing interconnect structures above the memory array.

It is desirable to provide a self-aligned process for the formation of isolation structures which overcomes problems discussed above with respect to the prior art. In addition, it is desirable to provide isolation structures which simplify planarization processes.

SUMMARY OF THE INVENTION

The present invention provides a self-aligned planarization and isolation technique which achieves smaller dimension memory cells based on self-aligned isolation trenches. The process involves defining the lines of buried diffusion and first layer of polysilicon using a single mask. A protective oxide is formed between the polysilicon lines. Then a second mask is used with non-critical alignment to select polysilicon lines to define self-aligned etch regions. The trenches are made using a high selectivity etching recipe which etches through polysilicon and the silicon substrate in the selected lines faster than the protective oxide. Thus, a single mask defines the diffusion regions, the first layer of polysilicon, and the isolation trenches. The mask used for selecting polysilicon lines for definition of isolation structures does not need to be critically aligned, removing the alignment tolerance for formation of the isolation structures out of the layout of the array.

Thus, the present invention can be characterized as a method for manufacturing integrated circuit memory array, such as a read-only memory or a floating gate memory array. The method comprises forming a multilayer structure which includes an insulating material and a conductive material used for the gates or floating gates on a semiconductor substrate. A pattern is etched in the multilayer structure having a plurality of substantially parallel multilayer lines with openings between the multilayer lines. A doping material is deposited in the semiconductor substrate through the openings to define a plurality of substantially parallel conductive regions in the semiconductor substrate. An insulating layer is formed over the parallel conductive regions and on the sides of the multilayer lines. A mask is formed over the patterned multilayer structure which exposes a selected set of the multilayer lines and portions of the adjacent conductive regions which remain covered by the insulating layer. Any misalignment tolerance involved in the masking step used for selecting multilayer lines which define the trenches, is absorbed by the insulating layers over the source and drain diffusion regions in the array. Thus, mask misalignment is not a factor in the formation of the isolation trenches.

An etch process is then applied which etches the selected set of multilayer lines and the underlying semiconductor substrate faster than the insulating layer to form trenches in the areas defined by the selected set of multilayer lines. Finally the trenches are filled with an insulating material using a process such as chemical vapor deposition or the like. According to a preferred embodiment, the step of filling the trenches includes filling regions between the remaining multilayer lines in the plurality of multilayer lines so that the insulating material is substantially coplanar with a top surface of the multilayer lines. For floating gate memory, a masking step is utilized to define the floating gates and word lines in a direction orthogonal to the multilayer lines, to form an integrated circuit memory array.

According to another aspect of the invention, after the step of filling the trenches, a second plurality of lines of conductive material is formed over, and in electrical contact with, the remaining multilayer lines to form composite floating gate conductors. The second plurality of lines are wider than the underlying multilayer lines in order to establish a greater effective floating gate width to control the coupling ratio of the device. A pattern is etched in the composite floating gate conductors to form the floating gate structures which are covered by insulators and word lines to form the resulting devices.

The present invention can be applied to every other multilayer line in the array, to form a standard AND or NAND type array. Alternatively, every third line, or every Nth line, can be utilized for the purposes of defining an isolation trench. When using every third line, the array can take the form of a virtual ground drain-source-drain architecture for the memory.

The multilayer structure according to preferred embodiment comprises a tunnel oxide covered by a floating gate polysilicon material. A thin layer of nitride or other protective material is deposited over the floating gate material. This composite multilayer structure is then etched as discussed above. The nitride or other protective material prevents the top of the floating gate from oxidizing during the step of forming an insulating layer over the conductive regions. The thin layer of nitride is removed from the top of the first layer of polysilicon, then the deposition of the second layer of polysilicon is used to form the extended floating gates.

Accordingly, the present invention provides a technique in which the polysilicon, the buried diffusion, and the isolation trenches are self-aligned. This allows very small critical dimensions to be applied in the layout of the array, without requiring space to be allocated to allow for misalignment of the buried diffusion and polysilicon layers with the isolation oxides. In addition, the tunnel oxide regions are not exposed to nitride or unnecessary high temperature processes, ensuring a high quality tunnel oxide.

Other aspects and advantages of the present invention can be seen upon review of the figures, the detailed description, and the claims which follow.

DETAILED DESCRIPTION

Figure 1:
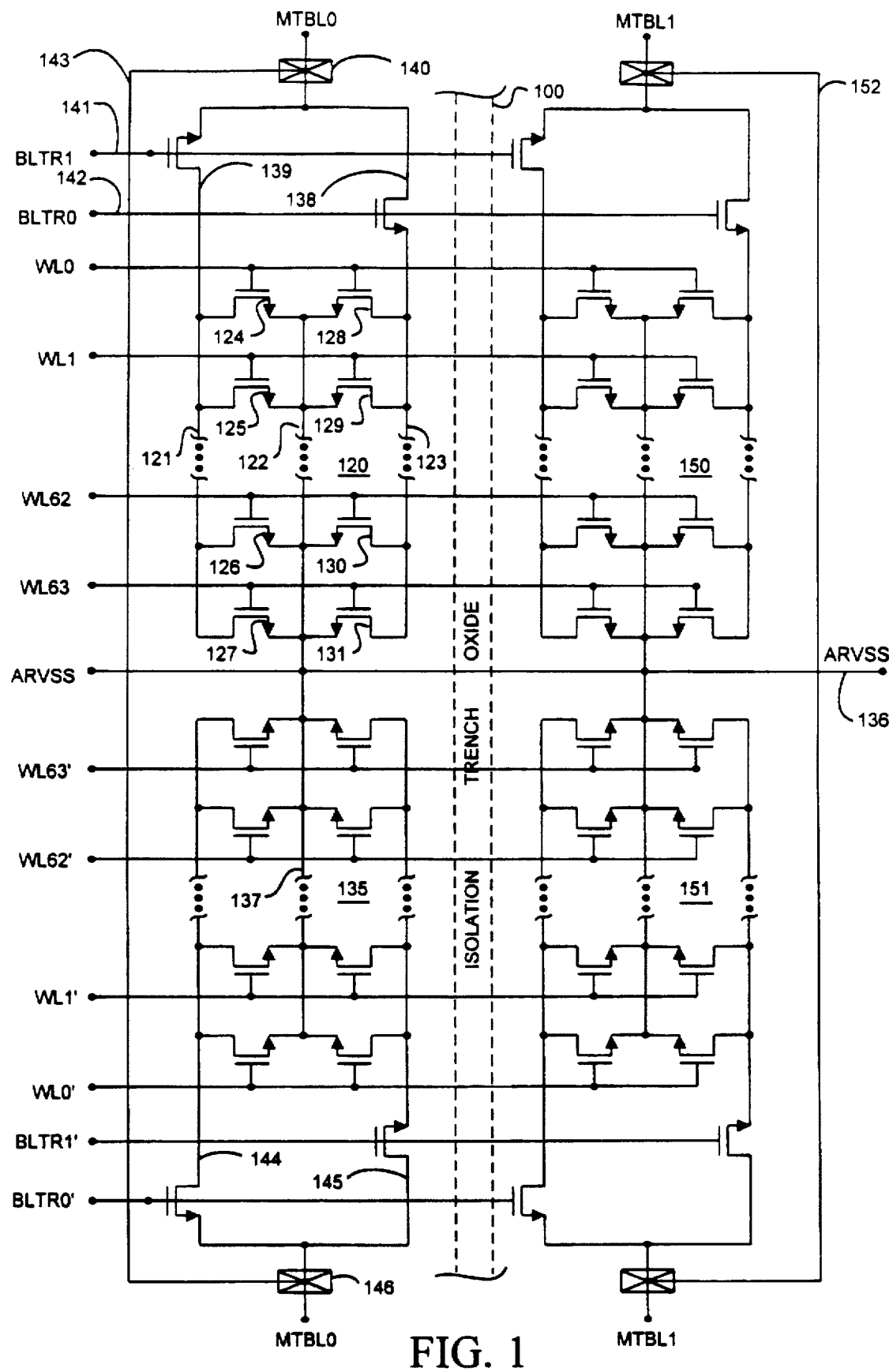
FIG. 1 is a schematic diagram of a high density memory array using the isolation trench oxide according to the present invention.

A detailed description of preferred embodiment is provided with reference to the figures, in which FIG. 1 illustrates a representative high density memory array architecture with which the present invention can be utilized; and FIGS. 2A through 2G and FIGS. 3A through 3C illustrate alternative applications of the isolation/planarization process used for forming memory arrays with isolation trench oxides according to the present invention.

For context, FIG. 1 illustrates a high density memory array for a floating gate memory device, such as an EEPROM type flash memory. The architecture is based on a drain-source-drain cell design in which two columns of cells share a single buried diffusion local source line. Between every set of two columns of cells an isolation structure is required. The isolation structure according to the present invention is an isolation trench oxide 100 as shown in the figure.

FIG. 1 also illustrates an architecture of the flash EEPROM array in which two columns of flash EEPROM cells share a single metal bit line. FIG. 1 shows four segments of the array, where each segment includes a pair of columns of flash EPROM cells in a drain-source-drain configuration. An isolation trench oxide 100 is formed between each pair of columns in this example.

Thus, the first segment 120 includes a first drain diffusion line 121, a source diffusion line 122, and a second drain diffusion line 123. Word lines WL0 through WL63 each overlay the floating gates of a cell in a first one of the pairs of columns and a cell in the second one of the pairs of columns. As shown in the figure, a first one of the pairs of columns includes cell 124, cell 125, cell 126, and cell 127. Not shown are cells coupled to word lines WL2 through WL61. The second one of the pair of columns includes cell 128, cell 129, cell 130, and cell 131. Along the same column of the array, a second segment 135 is shown. It has a similar architecture to the segment 120 except that it is laid out in a mirror image.

Thus, as can be seen, the transistor in the first one of the pair of columns, such as the cell 125, includes a drain in the drain diffusion line 121, and a source in the source diffusion line 122. A floating gate overlays the channel region between the first drain diffusion line 121 and the source diffusion line 122. The word line WL1 overlays the floating gate of the cell 125.

The segment 120 and segment 135 share an array virtual ground diffusion 136. Thus, the source diffusion line 122 of segment 120 is coupled to the diffusion line 136. Similarly, the source diffusion line 137 of segment 135 is coupled to the source diffusion line 136.

As mentioned above, each pair of columns of cells in a given segment (e.g., segment 120) shares a single metal line. Thus, a block right select transistor 138 and a block left select transistor 139 are included. The transistor 139 includes a source in the drain diffusion line 121, a drain coupled to a metal contact 140, and a gate coupled to the control signal BLTR1 on line 141. Similarly, the block right select transistor 138 includes a source in the drain diffusion line 123, a drain coupled to the metal contact 140, and a gate coupled to the control signal BLTR0 on line 142. Thus, the select circuitry, including transistors 138 and 139, provides for selective connection of the first drain diffusion line 121 and a second drain diffusion line 123 to the metal line 143 through metal contact 140. As can be seen, segment 135 includes left select transistor 144 and right select transistor 145 which are similarly connected to a metal contact 146. Contact 146 is coupled to the same metal line 143 as is contact 140 which is coupled to segment 120.

Segments are laid out horizontally and vertically to provide an array of flash EEPROM cells comprising M word lines and 2N columns. The array requires only N metal bit lines each of which is coupled to a pair of columns of flash EEPROM cells through select circuitry, as described above.

Figure 2A:
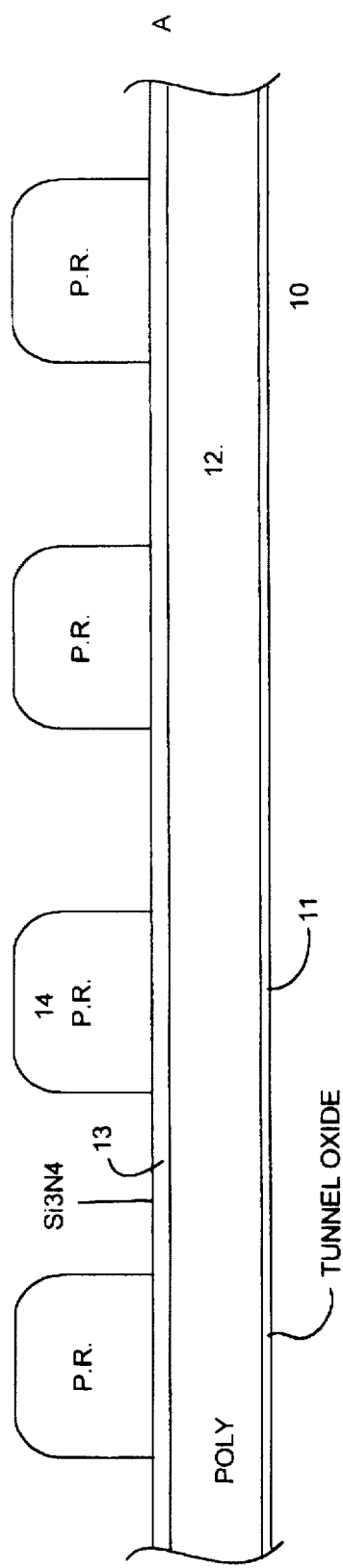
FIGS. 2A through 2G show the self-aligned isolation/planarization process used for a memory array such as that shown in FIG. 1.

FIGS. 2A through 2G illustrate the process for forming the memory array of FIG. 1 according to the present invention. As illustrated in FIG. 2A, a silicon substrate 10 is provided. A conventional tunnel oxide 11 is formed to a thickness of about 50 Å to 200 Å over the semiconductor substrate 10 in the area of the memory array. Over the tunnel oxide, a first layer of polysilicon 12 is formed in the area of the array. Next, a thin layer of silicon nitride 13 is formed over the polysilicon. The polysilicon is deposited for example using standard chemical vapor deposition processes with a temperature at about 620° C., an ambient pressure of about 0.3 torr using silane gas with a flow rate of about 280 sccm to a thickness of about 200 Å to 2000 Å. The silicon nitride is deposited for example using a process at about 700° C., with an ambient pressure at about 0.5 torr, using a 500 sccm flow of ammonium combined with about a 50 sccm flow of $SiH_2Cl_2$ to a thickness of about 20 Å to 1000 Å.

Figure 2B:
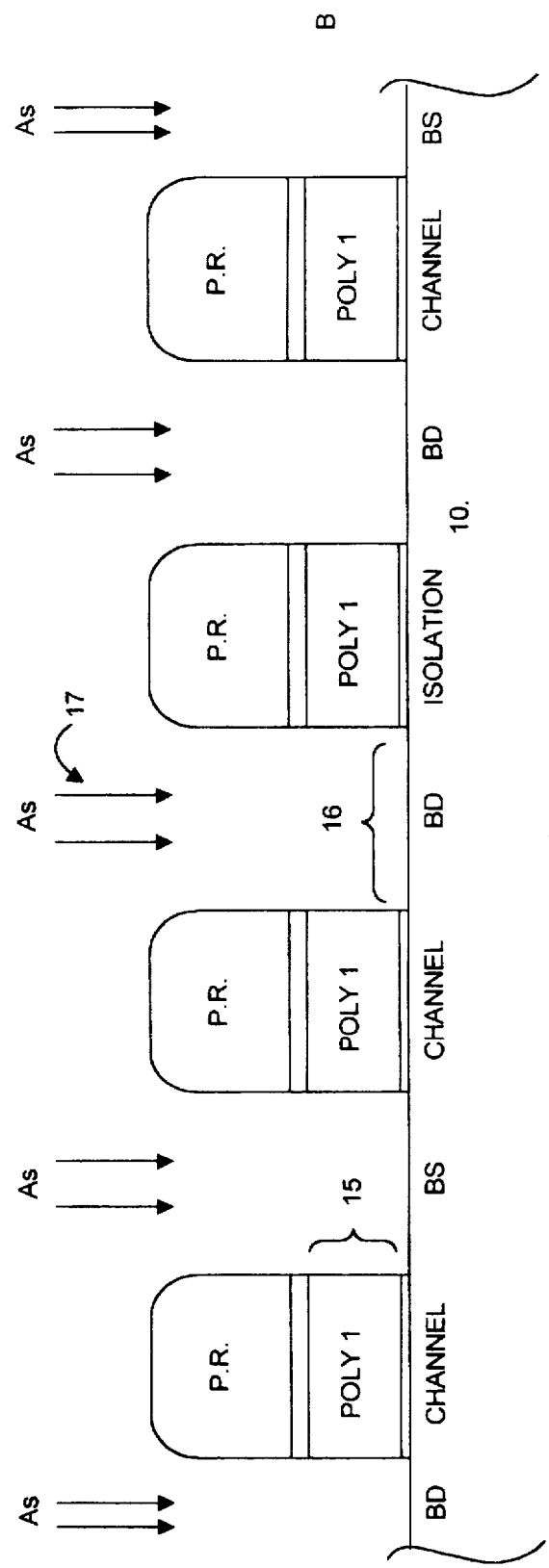

After the formation of this multilayer structure, a photoresist masking process is applied to define a plurality of columns. Thus, as shown in FIG. 2A, photoresist masks 14 are formed over the silicon nitride layer 13. An etch process is applied, such as a plasma or reactive ion etch to expose the silicon substrate 10 in openings between multilayer lines 15 as shown in FIG. 2B. After defining the multilayer lines, an implant process is executed to implant arsenic or other doping material, represented by the arrows generally 17, into the silicon substrate 10 in the regions 16 between the multilayer lines 15. After the arsenic implant, the photoresist mask 14 is removed. Alternatively, depending on the nature of the oxide layer 13, the photoresist mask 14 may be removed prior to the implant.

Figure 2C:
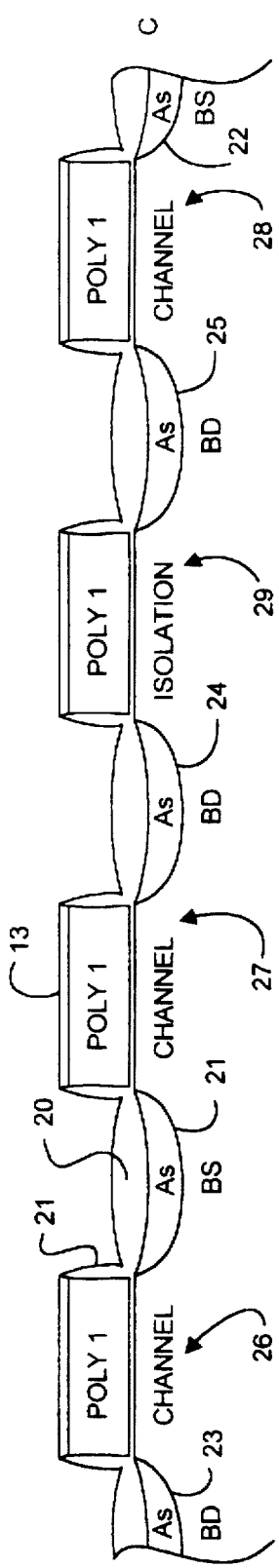

As illustrated in FIG. 2C, after the implant process, a short thermal oxidation is performed to form a layer of oxide 20 over the region 16 in which the implants were formed. The oxide 20 is also formed on the sides 21 of the multilayer lines 15. The nitride on top of the polysilicon on the multilayer line 15 protects the top of the polysilicon line from the oxidation process. Also, during the oxidation, the arsenic is annealed into the substrate forming the buried source regions 21, 22 and the buried drain regions 23, 24, 25.

The area 26 between the buried drain region 23 and the buried source region 21 provides a channel of a first floating gate device. Similarly, the region 27 between the buried source region 21 and the buried drain region 24 provides a second channel region. The region 28 between buried drain region 25 and buried source region 22 provides a channel region for an adjacent pair of columns. The region 29 between buried drain 24 and buried 25 is selected for an isolation structure.

Figure 2D:
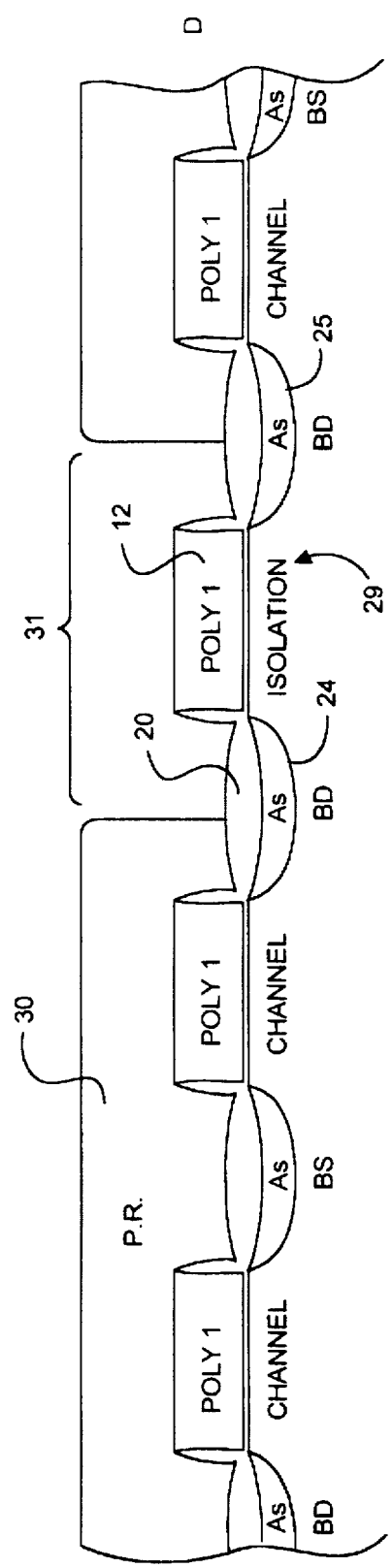

The isolation structure is formed as shown in FIG. 2D by first removing the nitride layer 13 from the top of the multilayer lines, followed by forming an isolation mask 30. The nitride removal may be done, for example, using a hot $H_3PO_4$ process at about 180° C. The isolation mask 30 is comprised of a photoresist or another masking material. As can be seen, the selected multilayer line over isolation region 29 is placed in opening 31 in the isolation mask 30. The opening 31 is wider than the isolation region 29 to allow for alignment tolerances, exposing the polysilicon layer 12, and portions of the insulating layer 20 over the buried drain regions 24 and 25.

After formation of the isolation mask 30, a highly selective etch process is applied which etches the polysilicon and silicon substrate much faster than the oxide. The highly selective etch process may be performed, for example, in the presence of $O_2$ and HBr in the presence of $Cl_2$/He at a pressure of between about 5 mTorr and 60 mTorr and at a power of between about 100 and 300 watts.

Isolation trench 35 is formed between the buried drain regions 24 and 25. The protective oxide 20 over the buried drain regions 24 and 25 is partially etched in the regions exposed by the mask 30 of FIG. 2D. However, because of the highly selective nature of the etch, trench 35 is formed after totally removing the polysilicon layer 12, and cutting through the thin tunnel oxide into the silicon substrate 10. After formation of the trench, the mask 30 is removed, yielding the structure shown in FIG. 2E.

The depth of the isolation trench 35 is preferably about 0.3 to about 0.5 microns for a device using a similar critical dimension width of the polysilicon lines. Isolation openings totally above the substrate, or having depths less than or greater than this example can be formed as needed for a particular application.

Figure 2E:
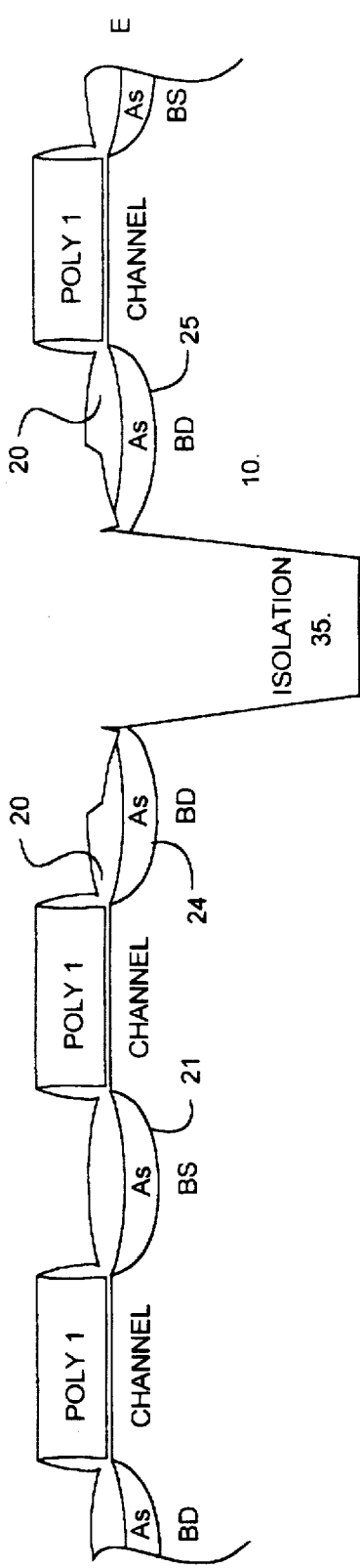

After formation of the trench as shown in FIG. 2E, insulating material is applied to fill the trench. The preferred insulation material is an oxide 36 deposited, for example, using a chemical vapor deposition process using a mixture of $N_2O/SiH_2Cl_2$ with a flow rate of about 180 sccm to 90 sccm at about 800° C. with an ambient pressure of about 0.4 torr. The deposition time for this process is proportional to the oxide thickness. Alternatively, a TEOS process can be applied, using a commercial TEOS material with a flow rate of about 100 sccm at about 700° C. with an ambient pressure of about 0.82 torr. The deposition time is proportional to the oxide thickness.

Figure 2F:
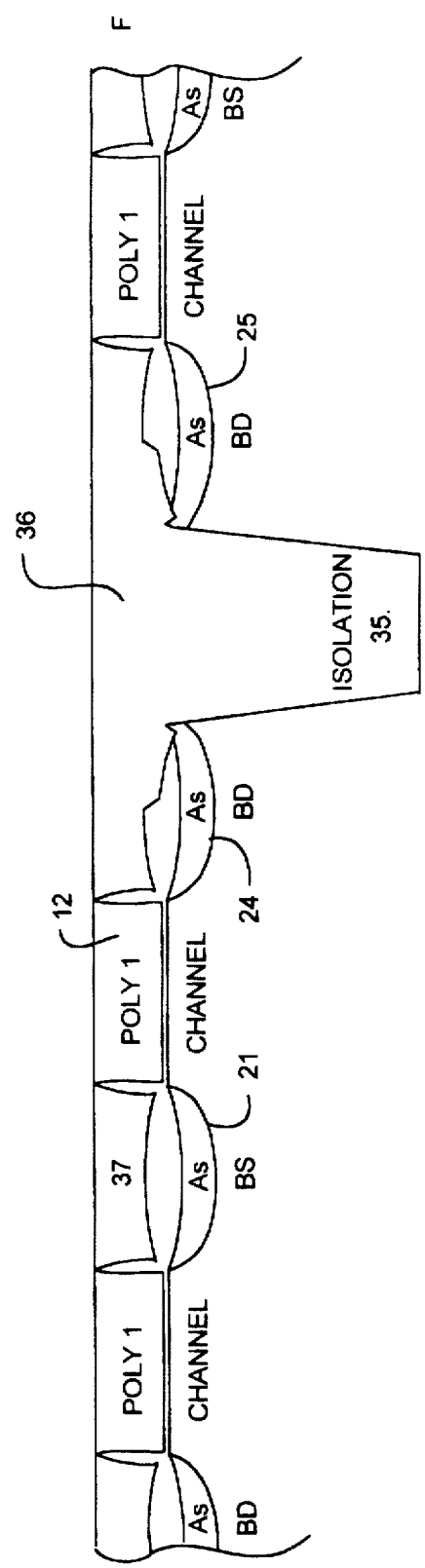

After the oxide 36 is grown, an etch back is performed which is stopped at the top of the polysilicon layers 12 to planarize the regions 37 between the remaining polysilicon lines, including in the isolation area 35 as shown in FIG. 2F.

Figure 2G:
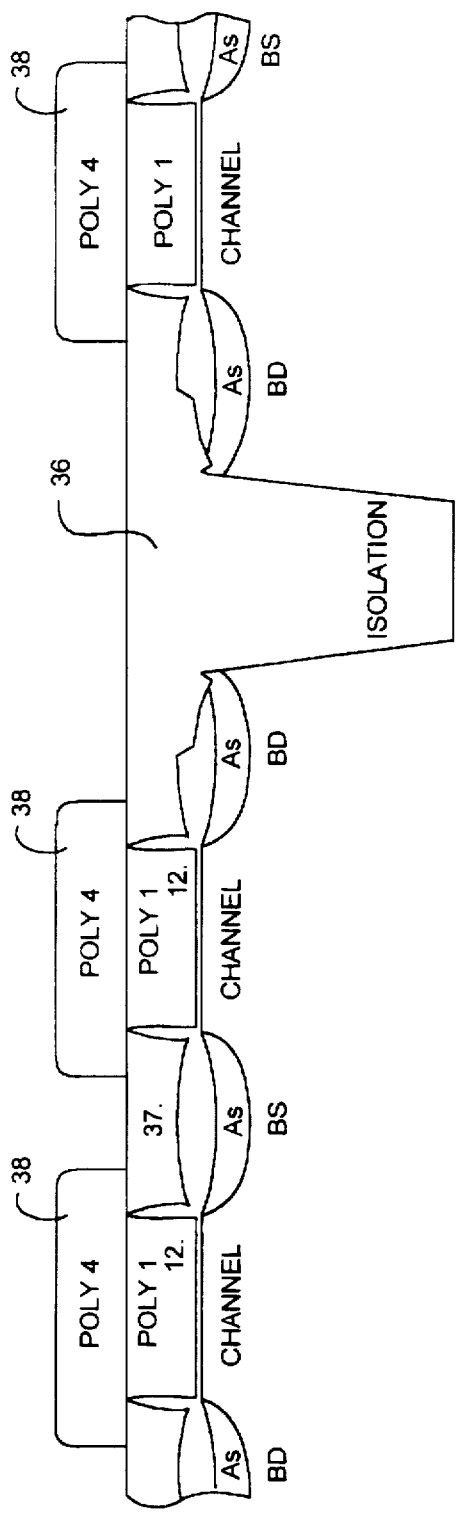

After planarization, a pattern of polysilicon lines 38 is formed over the remaining polysilicon lines 12, and in electrical contact with them as shown in FIG. 2G. The top polysilicon lines 38 are slightly wider than the underlying polysilicon lines 12, in order to extend the area of the floating gate structure.

Subsequent to deposition of the polysilicon lines 38, an interpoly dielectric, such as ONO, is formed over the structure, and a mask/etch process is applied to form the floating gate structures and word lines in lines along a direction substantially orthogonal to the isolation trenches 36.

The block select and array source voltage connectors are formed as described in co-pending PCT patent application number PCT/US94/10276, entitled A FLASH EPROM TRANSISTOR ARRAY AND METHOD FOR MANUFACTURING THE SAME; filed Sep. 13, 1994, which is incorporated by reference as if fully set forth herein. Thus, after overlying wordlines, block select structures, and metalization, a high density flash memory array is formed with self-aligned isolation/planarization structures.

Figure 3A:
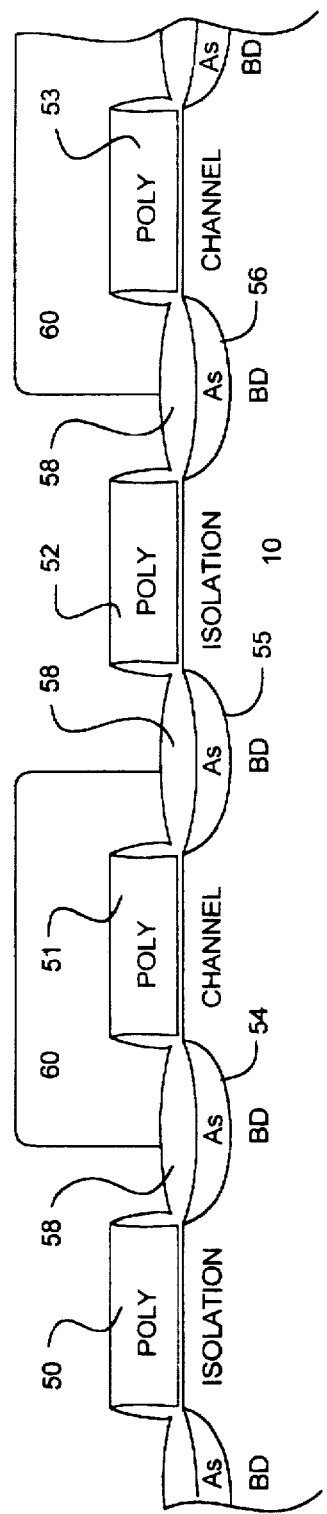
FIGS. 3A through 3C show the self-aligned isolation/planarization process used for an AND cell type, floating gate memory array.
Figure 3B:
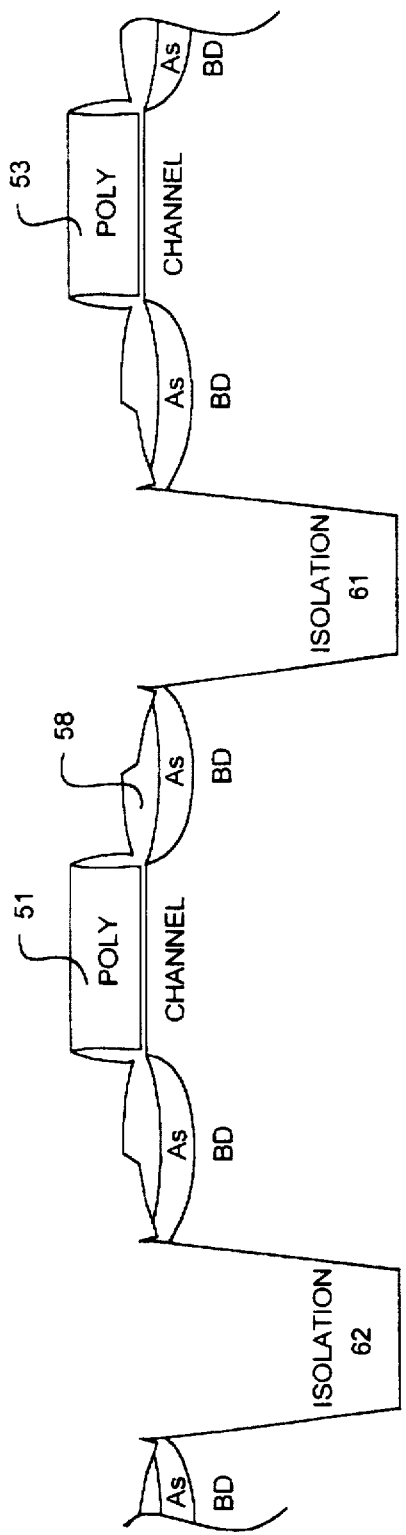
Figure 3C:
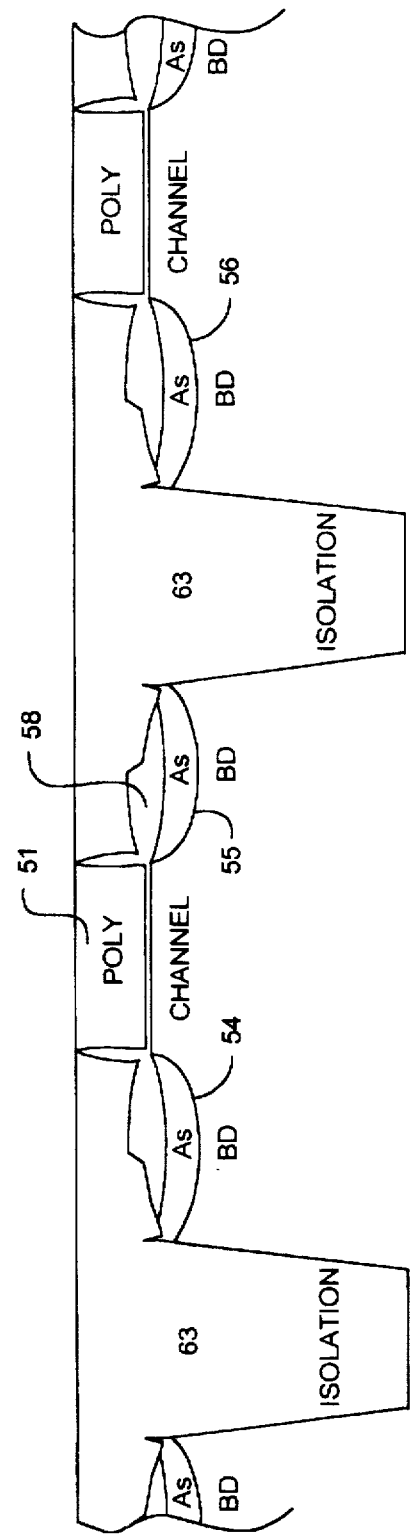

As shown in FIGS. 3A through 3C, the present invention can be applied to memory architectures other than that shown in FIG. 1. For instance, an AND cell memory array could be formed using this process. FIG. 3A shows the structure which is formed using the same process steps as FIGS. 2A through 2D. Thus, a plurality of polysilicon/tunnel oxide multilayer lines, such as lines 50, 51, 52, 53 are formed on a semiconductor substrate 10. Self-aligned buried diffusion regions 54, 55, 56 are formed between the multilayer lines. An insulating layer 58 is formed over the buried diffusion regions 54, 55, 56 and on the sides of the multilayer lines 50, 51, 52. The isolation mask 60 is formed over the resulting structure, the silicon nitride protecting layer over the polysilicon layer having been removed. The mask 60 selects every other multilayer line 50 and 52 to define the trenches to be formed. Thus, as shown in FIG. 3B, the selective etch is applied to form isolation trenches 61, 62 between each remaining polysilicon line 51, 53. A chemical vapor deposition oxide process is applied to fill the resulting trenches with oxide 63. An etch back process is applied to planarize the structure. Finally, the remaining process steps are executed to complete formation of the memory array as discussed above.

Thus, with respect to FIGS. 2A through 2G and 3A through 3C, the present invention has been described in which the polysilicon lines selected to define the isolation trenches are every third line or every other line. In other memory array architectures, the isolation trenches might by placed according to other patterns, such as every Nth line.

In addition, the isolation structures need not be straight parallel lines as described above. The same process can be used to form more complicated isolation shapes such as might be used in the block select structures and the like within the memory array.

Accordingly, the present invention provides a self-aligned isolation process particularly suited to the formation of high density read-only or floating gate memory arrays, with very small critical dimensions in the submicron range. The process results in greater uniformity in cell layout, higher density, and fewer process steps over the prior art. Further, the process does not involve exposing the sensitive tunnel oxide regions to nitrides and excessive thermal stress, such as encountered in prior art approaches.

The foregoing description of preferred embodiments of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A method for manufacturing an integrated circuit, comprising:

forming a patterned multilayer structure on a semiconductor substrate, the patterned multilayer structure having a plurality of multilayer lines, and openings between the multilayer lines, the multilayer lines including insulating material and conductive material;

depositing a dope material through the openings and into the semiconductor substrate beneath the openings to define a plurality of conductive regions in the semiconductor substrate;

forming an insulating layer over the conductive regions;

forming a mask over the patterned multilayer structure which exposes a selected set of the multilayer lines and portions of adjacent conductive regions;

etching in the presence of $O_2$ and HBr such that the selected set of multilayer lines is etched faster than the insulating layer to form isolation openings in the areas defined by the selected set of multilayer lines; and filling the isolation openings with insulating material.

2. The method of claim 1, including after the step of filling the isolation openings:

etching a pattern in remaining multilayer lines to form floating gate structures; and forming insulators and wordlines over the floating gate structures.

3. The method of claim 1, wherein the step of filling the isolation openings includes filling regions between remaining multilayer lines in the plurality of multilayer lines so that the insulating material is substantially coplanar with a top surface of the remaining multilayer lines.

4. The method of claim 3, wherein the step of filling the isolation openings includes filling the isolation openings so that the insulating material is higher than the top surface of the remaining multilayer lines, and etching the insulating material so that the insulating material is substantially coplanar with a top surface of the remaining multilayer lines.

5. A method for manufacturing an integrated circuit, comprising:

forming a patterned multilayer structure on a semiconductor substrate, the patterned multilayer structure having a plurality of multilayer lines, and openings between the multilayer lines, the multilayer lines including insulating material and conductive material;

depositing a dope material through the openings and into the semiconductor substrate beneath the openings to define a plurality of conductive regions in the semiconductor substrate;

forming an insulating layer over the conductive regions;

forming a mask over the patterned multilayer structure which exposes a selected set of the multilayer lines and portions of adjacent conductive regions;

etching, using an etch process which etches the selected set of multilayer lines faster than the insulating layer, to form isolation openings in the areas defined by the selected set of multilayer lines;

filling the isolation openings with insulating material;

forming a second plurality of lines of conductive material over and in electrical contact with the remaining multilayer lines in the plurality of multilayer lines to form composite floating gate conductors, the plurality of multilayer lines having first widths, and the second plurality of lines of conductive material having widths greater than the first widths; etching a pattern in composite floating gate conductors to form floating gate structures; and forming insulators and wordlines over the floating gate structures.

6. The method of claim 1, wherein the selected set of multilayer lines comprise every other multilayer line in at least a subset of the plurality of multilayer lines.

7. The method of claim 1, wherein the selected set of multilayer lines comprise every third multilayer line in at least a subset of the plurality of multilayer lines.

8. The method of claim 1, wherein the step of forming a patterned multilayer structure includes:

forming an insulating layer on the semiconductor substrate; and forming a layer of conductive material on the insulating layer.

9. The method of claim 8, including:

forming a layer of material over the layer of conductive material which protects the conductive material from the step of forming an insulating layer over the parallel conductive regions; and removing the layer of protective material from the selected multilayer structures prior to the step of etching to form isolation openings.

10. The method of claim 9, wherein the layer of insulating material comprises silicon dioxide and the layer of conductive material comprises polycrystalline silicon (polysilicon).

11. The method of claim 10, wherein the protective material comprises silicon nitride.

12. A method for manufacturing a floating gate memory array on an integrated circuit, comprising:

etching a pattern in a multilayer structure on a semiconductor substrate to form a patterned multilayer structure having a plurality of substantially parallel multilayer lines and openings between the multilayer lines, the multilayer structure including a tunnel insulating layer and a floating gate layer;

depositing a dope material through the openings and into the semiconductor substrate beneath the openings to define a plurality of buried diffusion conductive regions in the semiconductor substrate;

forming a source/drain insulating layer over the buried diffusion conductive regions;

forming a mask over the patterned multilayer structure which exposes a selected set of the multilayer lines and portions of the source/drain insulating layer over adjacent buried diffusion conductive regions;

etching in the presence of $O_2$ and HBr such that the selected set of multilayer lines and the underlying semiconductor substrate is etched faster than the source/drain insulating layer to form trenches in the areas defined by the selected set of multilayer lines;

filling the trenches with insulating material;

etching a pattern in remaining multilayer lines to form floating gate structures; and forming wordline insulators over the floating gate structures; and forming wordlines orthogonal to the buried diffusion conductive regions and over the wordline insulators on the floating gate structures.

13. The method of claim 12, wherein the step of forming a patterned multilayer structure includes forming a layer of protective material over the floating gate material, the protective material protecting the floating gate material from subsequent process steps; and including removing the layer of protective material prior to the step of forming wordline insulators.

14. A method for manufacturing a floating gate memory array on an integrated circuit, comprising:

etching a pattern in a multilayer structure on a semiconductor substrate to form a patterned multilayer structure having a plurality of substantially parallel multilayer lines and openings between the multilayer lines, the multilayer structure including a tunnel insulating layer and a floating gate layer;

depositing a dope material through the openings and into the semiconductor substrate beneath the openings to define a plurality of buried diffusion conductive regions in the semiconductor substrate;

forming a source/drain insulating layer over the buried diffusion conductive regions;

forming a mask over the patterned multilayer structure which exposes a selected set of the multilayer lines and portions of the source/drain insulating layer over adjacent buried diffusion conductive regions;

etching, using an etch process which etches the selected set of multilayer lines and the underlying semiconductor substrate faster than the source/drain insulating layer, to form trenches in the areas defined by the selected set of multilayer lines;

filling the trenches with insulating material;

etching a pattern in remaining multilayer lines to form floating gate structures; and forming wordline insulators over the floating gate structures;

forming wordlines orthogonal to the buried diffusion conductive regions and over the wordline insulators on the floating gate structures; and forming a second plurality of lines of conductive material over and in electrical contact with the remaining multilayer lines in the plurality of multilayer lines to form composite floating gate conductors, the plurality of multilayer lines having first widths, and the second plurality of lines of conductive material having widths greater than the first widths;

wherein the step of etching to form floating gate structures includes etching the composite floating gate conductors.

15. The method of claim 14, wherein the step of forming a patterned multilayer structure includes forming a layer of protective material over the floating gate material, the protective material protecting the floating gate material from subsequent process steps; and including removing the layer of protective material on the remaining multilayer lines prior to the step of forming a second plurality of lines.

16. The method of claim 15, wherein the protective material comprises silicon nitride.

17. The method of claim 16, wherein the source/drain insulating material comprises silicon dioxide.

18. The method of claim 12, wherein the tunnel insulating material comprises silicon dioxide and the layer of floating gate material comprises polycrystalline silicon (polysilicon).

19. The method of claim 12, wherein the selected set of multilayer lines comprise every other multilayer line in at least a subset of the plurality of multilayer lines.

20. The method of claim 12, wherein the selected set of multilayer lines comprise every third multilayer line in at least a subset of the plurality of multilayer lines.

21. The method of claim 12, wherein the step of filling the trenches includes filling regions between remaining multilayer lines in the plurality of multilayer lines until the insulating material is substantially coplanar with a top surface of the remaining multilayer lines.

22. A method for manufacturing a floating gate memory array on an integrated circuit, comprising:

forming a patterned multilayer structure on a semiconductor substrate having a plurality of multilayer lines and openings between the multilayer lines, the multilayer structure including a tunnel insulating layer, a floating gate layer, and a layer of protective material over the floating gate material, the protective material protecting the floating gate material from a subsequent process step;

depositing a dope material in the semiconductor substrate through the openings and into the semiconductor substrate beneath the openings to define a plurality of substantially parallel, buried diffusion conductive regions in the semiconductor substrate;

forming a source/drain insulating layer over the buried diffusion conductive regions;

forming a mask over the patterned multilayer structure which exposes a selected set of the multilayer lines and portions of the source/drain insulating layer over adjacent buried diffusion conductive regions;

etching in the presence of $O_2$ and HBr such that the selected set of multilayer lines and the underlying semiconductor substrate is etched faster than the source/drain insulating layer to form trenches in the areas defined by the selected set of multilayer lines;

filling the trenches with insulating material;

etching a pattern in remaining multilayer lines to form floating gate structures;

forming wordline insulators over the floating gate structures;

forming wordlines orthogonal to the buried diffusion conductive regions and over the wordline insulators on the floating gate structures; and removing the layer of protective material on the remaining multilayer lines prior to the step of forming wordline insulators.

23. A method for manufacturing a floating gate memory array on an integrated circuit, comprising:

forming a patterned multilayer structure on a semiconductor substrate having a plurality of multilayer lines and openings between the multilayer lines, the multilayer structure including a tunnel insulating layer, a floating gate layer and a layer of protective material over the floating gate material, the protective material protecting the floating gate material from a subsequent process step;

depositing a dope material in the semiconductor substrate through the openings and into the semiconductor substrate beneath the openings to define a plurality of substantially parallel, buried diffusion conductive regions in the semiconductor substrate;

forming a source/drain insulating layer over the buried diffusion conductive regions;

forming a mask over the patterned multilayer structure which exposes a selected set of the multilayer lines and portions of the source/drain insulating layer over adjacent buried diffusion conductive regions;

etching, using an etch process which etches the selected set of multilayer lines and the underlying semiconductor substrate faster than the source/drain insulating layer, to form trenches in the areas defined by the selected set of multilayer lines;

filling the trenches with insulating material;

etching a pattern in remaining multilayer lines to form floating gate structures;

forming wordline insulators over the floating gate structures;

forming wordlines orthogonal to the buried diffusion conductive regions and over the wordline insulators on the floating gate structures; and removing the layer of protective material on the remaining multilayer lines prior to the step of forming wordline insulators and after the step of forming a source/drain insulating layer; and forming, after the step of filling, a second plurality of lines of conductive material over and in electrical contact with the remaining multilayer lines in the plurality of multilayer lines to form composite floating gate conductors, the plurality of multilayer lines having first widths, and the second plurality of lines of conductive material having widths greater than the first widths;

wherein the step of etching to form floating gate structures includes etching the composite floating gate conductors.

24. The method of claim 23, wherein the tunnel insulating material comprises silicon dioxide and the layer of floating gate material comprises polycrystalline silicon (polysilicon).

25. The method of claim 24, wherein the protective material comprises silicon nitride.

26. The method of claim 25, wherein the source/drain insulating material comprises silicon dioxide.

27. The method of claim 22, wherein the selected set of multilayer lines comprise every other multilayer line in at least a subset of the plurality of multilayer lines.

28. The method of claim 22, wherein the selected set of multilayer lines comprise every third multilayer line in at least a subset of the plurality of multilayer lines.

29. The method of claim 22, wherein the step of filling the trenches includes filling regions between remaining multilayer lines in the plurality of multilayer lines until the insulating material is substantially coplanar with a top surface of the remaining multilayer lines.

30. A method for manufacturing an integrated circuit, comprising:

forming a patterned multilayer structure on a semiconductor substrate, the patterned multilayer structure having a plurality of multilayer lines, and openings between the multilayer lines, the multilayer lines including insulating material and conductive material;

depositing a dope material through the openings and into the semiconductor substrate beneath the openings to define a plurality of conductive regions in the semiconductor substrate;

forming an insulating layer over the conductive regions;

forming a mask over the patterned multilayer structure which exposes a selected set of the multilayer lines and portions of adjacent conductive regions;

etching, using an etch process which etches every third or more multilayer line in at least a subset of the plurality of multilayer lines faster than the insulating layer, to form isolation openings in the areas defined by the selected set of multilayer lines; and filling the isolation openings with insulating material.

31. A method for manufacturing a floating gate memory array on an integrated circuit, comprising:

etching a pattern in a multilayer structure on a semiconductor substrate to form a patterned multilayer structure having a plurality of substantially parallel multilayer lines and openings between the multilayer lines, the multilayer structure including a tunnel insulating layer and a floating gate layer;

depositing a dope material through the openings and into the semiconductor substrate beneath the openings to define a plurality of buried diffusion conductive regions in the semiconductor substrate;

forming a source/drain insulating layer over the buried diffusion conductive regions;

forming a mask over the patterned multilayer structure which exposes a selected set of the multilayer lines and portions of the source/drain insulating layer over adjacent buried diffusion conductive regions;

etching, using an etch process which etches every third or more multilayer line in at least a subset of the plurality of multilayer lines and the underlying semiconductor substrate faster than the source/drain insulating layer, to form trenches in the areas defined by the selected set of multilayer lines;

filling the trenches with insulating material;

etching a pattern in remaining multilayer lines to form floating gate structures; and forming wordline insulators over the floating gate structures; and forming wordlines orthogonal to the buried diffusion conductive regions and over the wordline insulators on the floating gate structures.

32. A method for manufacturing a floating gate memory array on an integrated circuit, comprising:

forming a patterned multilayer structure on a semiconductor substrate having a plurality of multilayer lines and openings between the multilayer lines, the multilayer structure including a tunnel insulating layer, a floating gate layer, and a layer of protective material over the floating gate material, the protective material protecting the floating gate material from a subsequent process step;

depositing a dope material in the semiconductor substrate through the openings and into the semiconductor substrate beneath the openings to define a plurality of substantially parallel, buried diffusion conductive regions in the semiconductor substrate;

forming a source/drain insulating layer over the buried diffusion conductive regions;

forming a mask over the patterned multilayer structure which exposes a selected set of the multilayer lines and portions of the source/drain insulating layer over adjacent buried diffusion conductive regions;

etching, using an etch process which etches every third or more multilayer line in at least a subset of the plurality of multilayer lines and the underlying semiconductor substrate faster than the source/drain insulating layer, to form trenches in the areas defined by the selected set of multilayer lines;

filling the trenches with insulating material;

etching a pattern in remaining multilayer lines to form floating gate structures;

forming wordline insulators over the floating gate structures;

forming wordlines orthogonal to the buried diffusion conductive regions and over the wordline insulators on the floating gate structures; and removing the layer of protective material on the remaining multilayer lines prior to the step of forming wordline insulators.

* * * * *